United States Patent
Tarakji et al.

(10) Patent No.: US 10,559,594 B2
(45) Date of Patent: Feb. 11, 2020

(54) APPROACH TO THE MANUFACTURING OF MONOLITHIC 3-DIMENSIONAL HIGH-RISE INTEGRATED-CIRCUITS WITH VERTICALLY-STACKED DOUBLE-SIDED FULLY-DEPLETED SILICON-ON-INSULATOR TRANSISTORS

(71) Applicants: Ahmad Tarakji, Sacramento, CA (US); Nirmal Chaudhary, Leesburg, VA (US)

(72) Inventors: Ahmad Tarakji, Sacramento, CA (US); Nirmal Chaudhary, Leesburg, VA (US)

(*) Notice: Subject to any disclaimer, the term of this patent is extended or adjusted under 35 U.S.C. 154(b) by 0 days.

(21) Appl. No.: 15/731,051

(22) Filed: Apr. 11, 2017

(65) Prior Publication Data
US 2018/0294284 A1  Oct. 11, 2018

(51) Int. Cl.
| | |
|---|---|
| *H01L 27/12* | (2006.01) |
| *H01L 23/00* | (2006.01) |
| *H01L 29/786* | (2006.01) |
| *H01L 27/02* | (2006.01) |
| *H01L 21/8226* | (2006.01) |
| *H01L 21/768* | (2006.01) |

(52) U.S. Cl.
CPC .... *H01L 27/1207* (2013.01); *H01L 21/76802* (2013.01); *H01L 21/8226* (2013.01); *H01L 24/29* (2013.01); *H01L 24/83* (2013.01); *H01L 27/0207* (2013.01); *H01L 29/78648* (2013.01); *H01L 2224/83895* (2013.01); *H01L 2224/83896* (2013.01)

(58) Field of Classification Search
CPC ............ H01L 27/0207; H01L 21/8226; H01L 29/78648; H01L 21/76802
See application file for complete search history.

(56) References Cited

U.S. PATENT DOCUMENTS

| | | | | |
|---|---|---|---|---|
| 5,087,585 | A * | 2/1992 | Hayashi | H01L 21/6835 257/E21.705 |
| 5,227,013 | A * | 7/1993 | Kumar | H01L 21/486 216/18 |
| 5,374,564 | A | 12/1994 | Bruel | |
| 5,376,559 | A * | 12/1994 | Mukai | H01L 29/66772 148/DIG. 12 |
| 6,022,804 | A * | 2/2000 | Yano | H01L 23/5226 257/E23.145 |
| 6,245,664 | B1 * | 6/2001 | Miyai | H01L 21/76802 257/E21.577 |
| 6,346,446 | B1 * | 2/2002 | Ritenour | H01L 21/84 257/260 |
| 6,455,398 | B1 * | 9/2002 | Fonstad, Jr. | G02B 6/1245 257/E21.088 |
| 6,984,571 | B1 * | 1/2006 | Enquist | H01L 21/2007 148/DIG. 12 |

(Continued)

*Primary Examiner* — Stephen M Bradley

(57) ABSTRACT

A new architecture to fabricate high-rise fully monolithic three-dimensional Integrated-Circuits (3D-ICs) is described. It has the major advantage over all known prior arts in that it substantially reduces RC-delays and fully eliminates or very substantially reduces the large and bulky electrically conductive Through-Silicon-VIAS in a monolithic 3D integration. This enables the 3D-ICs to have faster operational speed with denser device integration.

2 Claims, 4 Drawing Sheets

(56) References Cited

U.S. PATENT DOCUMENTS

| | | | | |
|---|---|---|---|---|
| 7,564,135 B2* | 7/2009 | Park | .................. | H01L 21/76897 |
| | | | | 257/758 |
| 8,288,250 B2* | 10/2012 | Clavelier | ............ | H01L 21/7813 |
| | | | | 438/459 |
| 9,564,432 B2 | 2/2017 | Or-Bach et al. | | |
| 9,577,642 B2 | 2/2017 | Or-Bach et al. | | |
| 2003/0113961 A1* | 6/2003 | Horiuchi | ................. | H01L 21/84 |
| | | | | 438/157 |
| 2004/0137716 A1* | 7/2004 | Park | .................. | H01L 21/76802 |
| | | | | 438/629 |
| 2004/0266168 A1* | 12/2004 | Koyanagi | ........... | H01L 21/8221 |
| | | | | 438/622 |
| 2006/0024948 A1* | 2/2006 | Oh | .................... | H01L 21/76807 |
| | | | | 438/622 |
| 2007/0187719 A1* | 8/2007 | Yuan | ........................ | H01L 21/84 |
| | | | | 257/202 |
| 2012/0013013 A1* | 1/2012 | Sadaka | ............... | H01L 21/2007 |
| | | | | 257/773 |
| 2012/0248544 A1* | 10/2012 | Yokoyama | ............ | H01L 23/481 |
| | | | | 257/369 |

* cited by examiner

/Ahmad Houssam Tarakji/

Applicant & inventor

APPROACH TO THE MANUFACTURING OF MONOLITHIC 3-DIMENSIONAL HIGH-RISE INTEGRATED-CIRCUITS WITH VERTICALLY-STACKED DOUBLE-SIDED FULLY-DEPLETED SILICON-ON-INSULATOR TRANSISTORS

BACKGROUND OF THE INVENTION

As the Semiconductor industry is entering the era that foresees the end of miniaturization of the Silicon transistor, engineers are already considering newer approaches to boost the device density, the efficiency, and the performance of the logic and memory Chips without necessitating the move to smaller transistors. Although Three-Dimensional (3D) circuits are nothing new given that Integrated-Circuits (ICs) are routinely packaged nowadays one on top another via wire-bonds or large copper pillars called Through-Silicon-Via's (TSV's) that vertically connect the ICs together, the concept has still limitations. For one thing, these 3D-Packages are interconnecting the subsystems and not their discrete components. This is consequently limiting the density of 3D interconnections and the overall Chip performance. Further, even in substituting wire-bonds with TSV's the resulting effects from RC delays and higher impedances between subsystems were reported to still impose reduced electrical performance, high parasitic power consumption, and poor heat dissipation. Among the many published literatures detailing on these effects are those by Pulkit Jath et al., "*Three Dimensional Integrated Circuit Design*", *Chapter 3: Thermal and power delivery Challenges in 3D ICs, pp. 33-61, Springer Science+Business Media, LLC*, 2010; and Mohammad A. Ahmed et al., "*Delay and power optimization with TSV-aware 3D floorplanning*", *2014 15th International Symposium on Quality Electronic Design (ISQED)*, pp. 189-196, Santa Clara, Calif., March 2014.

Today's cutting-edge Integrated-Circuits have only recently started allowing full monolithic vertical stacking of the active transistors on top of each other. Method to this vertical monolithic integration use exact same technique that is utilized nowadays in the standard commercial productions of the Silicon-On-insulator (SOI) wafers, that is: The Smart-Cut approach, also known as, Ion-Cut, or Layer-Transfer. It was initially described and demonstrated by M Bruel, B. et al., "*Smart-Cut: A New Silicon On Insulator Material Technology Based on Hydrogen Implantation and Wafer Bonding*", *Japanese Journal of Applied Physics*, 36, 1636, 1997, and was being continuously improved upon over the past 20 years. Several Patents are already filed on the manufacturing of monolithic 3D-ICs using this Smart-Cut approach, among which are the works by, Zvi Or-Bach et al., U.S. Pat. No. 9,564,432 B2, "3D Semiconductor Device and Structure", Feb. 7, 2017, and, Zvi Or-Bach, U.S. Pat. No. 9,577,642 B2, "Method to Form a 3D Semiconductor Device", Feb. 2, 2017. The core concept in these newly filed patents is founded on vertically stacking through Smart-Cuts thin layers of virtually defect-free Silicon; with their Inline dielectrics firmly bonded together and sandwiched between these layers. The active transistors are designed and built on these vertically stacked thin layers of silicon that are separated from each other with inline dielectrics and Metal interconnects. Vertical TSVs cut through these stacked layers of silicon and vertically wire transistors together. Early gross results from this method to monolithic 3D integration already reported on much shorter overall wires between transistors. This appears to already tackle the well-known wire-delay problems in today's commercial ICs and that are caused from no other than the inter-wirings of the transistors through multi layers of Metals and thick inline dielectrics. It was specifically reported that more than an order of magnitude improvement in the "Power×Area×Delay" figure-of-merit does result. Also reported were ~34% consequent shorter wire-lengths, ~26% improvement in power consumption, and more than 50% reduction of die-area. Relating findings were reported by Zhou et al., "*Implementing a 2-Gbs 1024-bit ½-rate low-density-parity-check code decoder in three-dimensional integrated circuits*", *Proceedings of the 25th IEEE International Conference on Computer Design (ICCD)*, pp. 194-201, October 2007, and, Neela Lohith Penmetsa et al., "*Low Power Monolithic 3D IC Design of Asynchronous AES Core*", *Proceedings of the 2015 21st IEEE International Symposium on Asynchronous Circuits and Systems*, May 2015. This same monolithic stacking of transistors also demonstrated strong potential to the continuation of Moore's law by continuously increasing the number of transistors per unit-area through this vertical expansion. Gains in device densities that are equivalent to two generations of Dennard scaling were reported by *Synopsys, Proceedings of the 3D Architectures for Heterogeneous Integration and Packaging*, December 2010.

Despite all the above enhancements more power-efficient high-speed eDcircuits still require more reduced RC delays and shorter interconnects. Capacitive coupling through the dielectric sidewalls between the TSVs and the silicon substrates was still reported to impose limitation on higher speed. This was described in many literatures among which is the work by, Dae Hyun Kim et al., "*Fast and Accurate Analytical Modeling of Through-Silicon-Via Capacitive Coupling*", *IEEE Trans. Comp. Pack. Manuf. Tech.*, vol. 1, no. 2, February. 2011.

Additionally, the use of these large bulky TSVs to vertically connect devices together can have many related manufacturing snags. It also offers a rather limited potential to vertically monolithically integrate in high volume the components (e.g. transistors) together.

The long established approach to increasing the CPU performance prior to the 180 nm CMOS technology node was to reduce the device Gate length so to drastically boost this device performance which consequently boosted overall CPU speed (or performance). After the 90 nm node RC delays from the Backend process started to significantly dominate the CMOS speed. Reduction of the Gate lengths no longer increased device level speed but rather enabled denser device level integrations. This trend of continuously increasing the Cache memory through denser device level integrations has been continuing since generation after generation following the prediction of Moore's law and it did enable continuous faster computations. This also paved way to the monolithic multi-coring of CPUs and exploited the computational parallelisms in a single chip die. This trend of continuously multi-coring monolithically and increasing the Cache size is still the standard that is adopted today to increase computational parallelisms and boost the computing speed in today's microprocessors. Major hurdle of that approach is however that this trend cannot continue forever. It is well established today that the transistors Gate length will no longer shrink beyond the 5 nm process technology (5 nm node). This will ultimately cause the size of future microprocessor dies to start increasing drastically shall this "brute-force" trend of continuously multi-coring and increasing the Cache size continue. Aside from this foreseen limitation, the today's microprocessors have become highly energy-inefficient. This is simply because of their very high transistor-counts that are causing the off-state or leakage (standby) power in the transistors to start dominating the total consumed power. Their active power is also no longer converting efficiently to performance because of Backend delays. Smarter ways to realizing denser device level integrations and faster computations are crucially needed today.

Reduced RC delays with denser device level integrations through fully monolithic three-dimensional (ICs) can be the ultimate realizable long-term approach to this dilemma that is plaguing the semiconductor industry today. Added device level control that intelligently optimizes the power consumed in the modules of these ICs and alternates their operation between a standby mode and high performance can provide further substantial boost to both power-efficiency and highest performance.

BRIEF SUMMARY OF THE INVENTION

After the 90 nm CMOS technology node the RC delays from the inline interconnects have become substantially pronounced to dominate the speed of Central-Processing-units (CPUs). In today's most advanced systems these RC delays are already two to four orders of magnitude higher than the device Gate delays. This is negating in the first place all and any performance enhancements from the Frontend. Furthermore it is well known that the inline interconnects alone in these technology nodes are accounting to more than 50% of the dynamic dissipated total power in processors. Because of these, any and all progress to the performance and to the power-efficiency of microprocessors, microcontrollers and most ICs has become largely dependent today on reducing RC delays and the parasitic power consumed in inline interconnects. This invention reduces the lengths, the impedances and the RC delays of interconnects that wire the different discrete transistors in monolithic Three-Dimensional Integrated-Circuits (3D-ICs); it therefore eliminates or substantially reduces the much longer wirings that interconnect the transistors in today's modern CPUs. It also allows very dense interconnections to be realized between the discrete devices or transistors in same 3D-ICs. The vertical wiring of transistors will no longer require the thick, bulky and "difficult to manufacture" through-Silicon-Vias (TSVs) that some prior art is using today. These thick bulky TSVs do limit the volume to vertically integrate the transistors. This invention rather comprises discrete ultra-thinned (3-100 nm) semiconductor (e.g. silicon) films embodying transistor structures that are fully submerged and dispersed in thick inline dielectric. The invention is distinctly unique in that these discrete transistors are optimally positioned one on top another and are interconnected or inter-wired inside this dielectric in Three-Dimensional configurations. Transistors no longer need to interconnect by climbing many higher Metal layers and tumbling down, like in today's CPUs, they will rather interconnect laterally and on top of one another in fully monolithic Three-Dimensional integrations. The invention is peculiar in its innovative new architecture that enables interconnects to contact the Drain and Source of a transistor at more than one surface of its semiconductor film wherein these Drain and Source regions overlap the many surfaces of this transistor that are exposed to the inline dielectric. This enables a transistor in one semiconductor film to connect to other transistor in different semiconductor film with much shorter wiring(s). Same invention also encompasses dual-gate MOSFET designs that make use of secondary fully independent Gate that intelligently fine-tunes in real-time the device threshold-voltage while all the primary Gates of devices are affixed or tied to their Logic or Memory circuits. A Gate of one transistor can connect to a Gate of another transistor that is embodied in different semiconductor film via shortest cut that minimizes the length of this wiring. Ultra-thinned sheets of semiconductor (e.g. silicon) incorporating a one Gate with its corresponding insulating dielectric on each of the two surface sides of this ultra-thinned semiconductor form this dual-gate MOSFET. Its Gates work-functions are specially tailored to lower device threshold-voltage and provide good short-channel control for off-state leakage current.

In such dual-gate MOSFETs one Gate can or will assume the functionality of the Back-Gate in today's conventional Fully-Depleted Silicon-On-Insulator transistors and serves as a fully independent knob that can be software-programmed to intelligently boost or reduce the on-state performance (through automatically fine-tuning the device Threshold-Voltage) such to best optimize the power consumption for given performance. This does or will drastically reduce the parasitic power consumed in the standby modules and in Memories (e.g. in SRAM cells). It for example enables a Drone or an Areal-Vehicle-System (AVS) to intelligently fine-tune or alternate the mode of its operation for lowest consumed power when it is simply flying and for highest performance while it rapidly processes and analyzes areal images and/or detects and tracks given target(s). It can also serve to intelligently slow-down specific overheated modules (or subsystems) of an Integrated-Circuit (IC) temporarily till they get cooled-down instead of fully shutting them off during this cooling process.

DETAILED DESCRIPTION OF THE INVENTION

Figure 1:
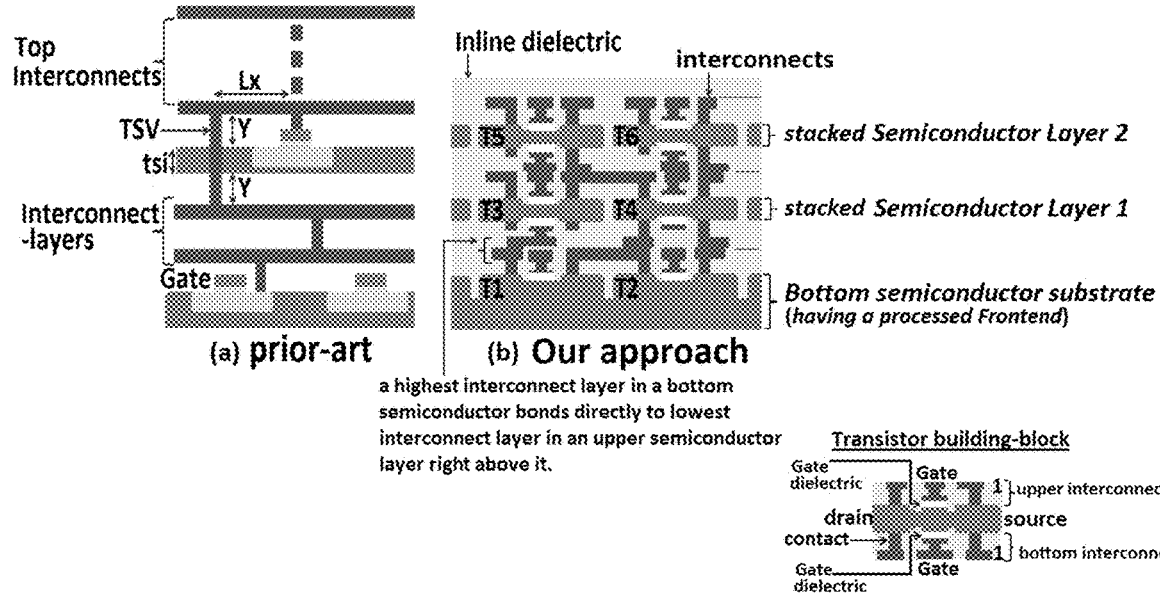
FIG. 1: Schematics showing a side-by-side comparison of the prior art to monolithic 3D-IC that requires the use of TSVs and round-around Copper wirings to interconnect the transistors vertically versus our new approach in this patent that fully eliminates the use of the TSVs and round-around Copper wirings. Our new approach shows transistors: T1, T2, T3, T4, T5 and T6 interconnected together through inline dielectric and wherein transistors in bottom semiconductor have 1 layer of interconnects, and the stacked semiconductor layers have 1 layer of upper interconnects and 1 layer of bottom interconnects each.
Figure 2:
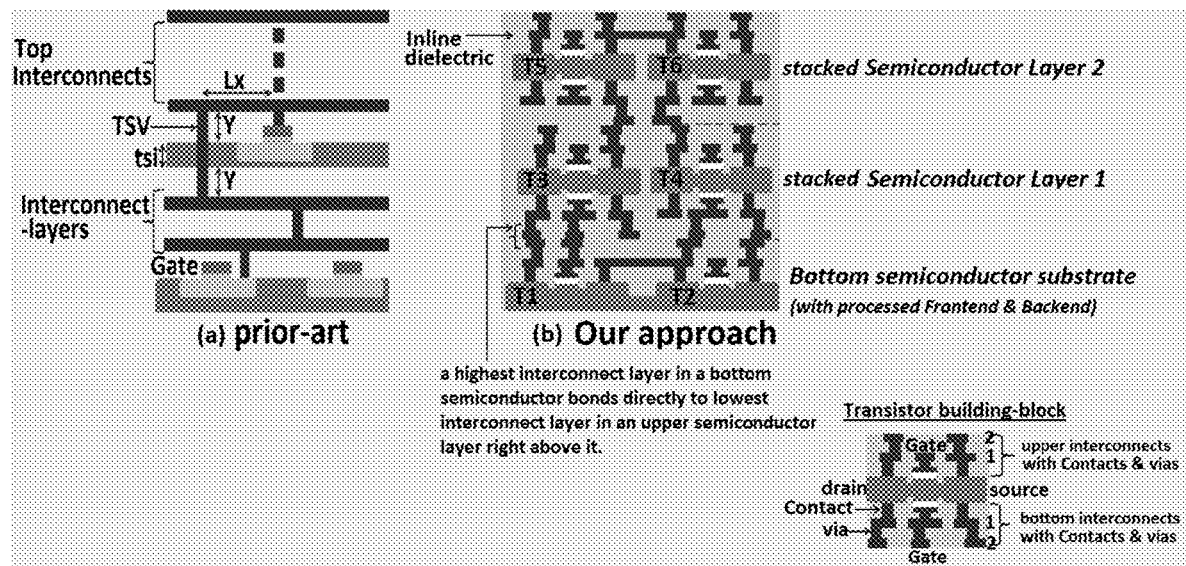
FIG. 2: Other configuration for our monolithic 3D-IC architecture showing transistors: T1, T2, T3, T4, T5 and T6 interconnected together through inline dielectric and wherein transistors in bottom semiconductor have 2 layers of interconnects, and the stacked semiconductor layers have 2 layers of upper interconnects and 2 layers of bottom interconnects each.
Figure 3:
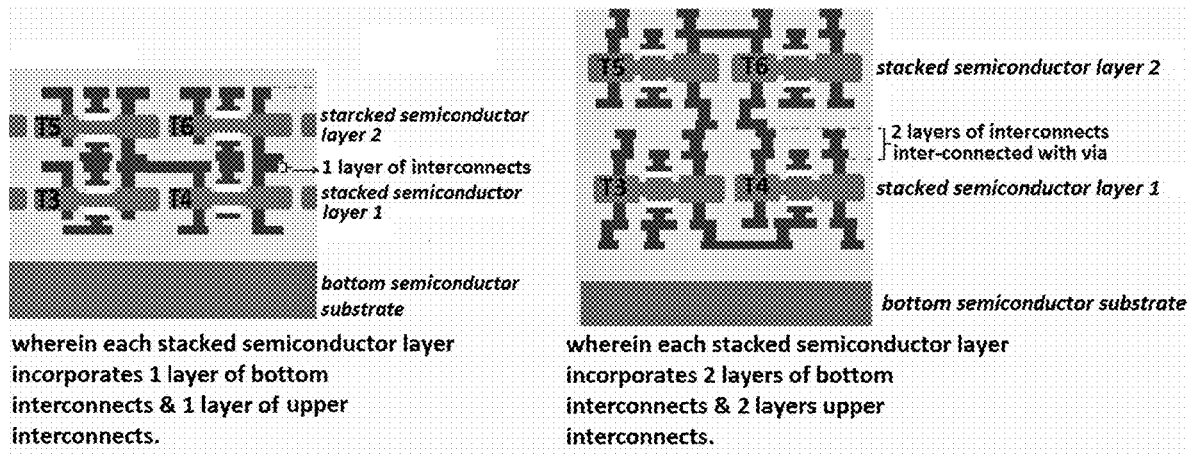
FIG. 3: Configurations for our monolithic 3D-IC architecture with no processed transistors in bottom semiconductor substrates (no Frontend and no Backend).

FIG. 1, FIG. 2 and FIG. 3 show a side-by-side comparison between the prior-art to monolithic 3D-ICs that is being considered and evaluated today, and our new-approach that eliminates the TSVs. Our new-approach is shown to include four transistors: T1, T2, T3, and T4, wired to each other in a dielectric through inline interconnects. The transistor's Drain and Source regions in our new-approach to monolithic 3D-IC architecture encompass or cover the many surface sides of the thinned semiconductor films that are exposed to the inline dielectric. This enables a Drain or a Source of one transistor to contact the terminal(s) (Drain, Source, Gate) of another transistor with shortest possible path(s) and without having interconnect(s) go around either of the two transistors like in the case of prior-art which representative schematic is shown next to the representative schematic of our new-approach. This significantly reduces delays and power consumptions in interconnects. When dual-Gate MOSFETs are used as the building-components in this new-approach to monolithic 3D-IC a Gate of one transistor can also similarly contact the Gate of another transistor with shortest wiring and without having the interconnect go around that transistor. This also similarly reduces the lengths of interconnects by deducting portion from the total length of an interconnect equaling anywhere between: tsi+Y and tsi+Y+Lx. tsi is the thickness of the semiconductor film that embodies a transistor structure in prior-art, Y is the established design-rule between this semiconductor film and its closest planar Metal layer. Lx is the established design-rule between Gate Contact or Drain/Source Contacts and the TSV. Given the billions of transistors that will form such monolithic 3D-IC tremendous reduction in the total power that dissipates in interconnects will be realized through this new-approach. Additionally same new approach to monolithic 3D-IC enables any two lateral transistors or more which Drain and Source lay in same two-dimensional plane to interconnect with shorter overall interconnects. This is simply because the transistors in our new-approach to monolithic 3D-IC can interconnect to each other through more than one surface side of their semiconductor films. This is being clearly illustrated in the schematics of FIG. 4. The two transistors that lay in same "X-Y" two-dimensional plane can interconnect to each other with our new approach to monolithic 3D-IC with interconnects lengths that are at least 2×DR1 and 2×DR2 less than what similar interconnections in today's conventional CPU architectures would require. DR1 is the design-rule spacing between two Metal layers (e.g. the Metal 1 layer and the Metal 2 layer). DR2 is another design-rule length that defines the size (or dimension) of a Metal layer extending along and beyond the transistor's peripheral width in direction that is orthogonal to the axis that aligns the corresponding Source, Gate and Drain of that transistor. This allows more ease and flexibility in interconnecting the transistors together and can similarly trim the total power that dissipates in interconnects (e.g. interconnects will no longer have to go through longer higher Metal-Layers to interconnect and can interconnect instead through the other side of their semiconductor film). One more advantage of our new-approach to monolithic 3D-IC is the added secondary Gate to transistors. This enables each transistor to have an additional Gate terminal that connects to separate fully independent circuits and logic modules with sensors that intelligently slowdown or speedup the performance of each transistor independently by changing in real-time it threshold-voltage for best performance and power efficiency. One example requiring such real-time control of threshold-voltage are processors and memories in flying Unmanned-Areal-Vehicle (UAV); with our 3D-ICs these would be able to operate at lowest speed to conserve power during long flight missions while they can instantly switch to extreme high performance when they detect and/or track a target. Another advantage of the secondary Gate in transistors is its ability to vertically route electric signals by purposely turning-off particular transistor through instantly shifting their threshold-voltage (active vertical routing). This enables or facilitates real-time reconfigurable 3D computing with much denser 3D-integration and shorter RC-delays. All these merits in our new-approach to monolithic 3D-IC are summarized in the FIG. 5.

First phase in the fabrication of this 3D-IC architecture starts by manufacturing the so-called Base-Layer; this is the semiconductor layer atop which all thinned semiconductor films will stack with their inline dielectric and interconnects. The fabrication steps for this base-layer are described in the Step-1 and Step-2 below:

Step-1: Front semiconductor of a seed-Wafer is thoroughly cleaned with the standard Cleans that are used in today's most advanced CMOS processes. High quality epitaxy may be grown atop this seed-wafer. Nitride antireflective coating is deposited, and Shallow Trenches for Isolation (STI) in the semiconductor are then patterned, etched, and filled with dielectric. The Nitride film is then selectively removed. This is followed with a very thorough Clean of the surface. The resulting step-height (sh) of the Isolation-trenches is used afterward for aligning the Frontend.

Step-2: N- and P-regions are patterned, implanted and the devices are fabricated following today's standard CMOS processes. These include: The processing of highest quality Gate dielectric, Silicide formation, anneals, the patterning, etch and formation of trenched-Contacts, deposition of inline dielectric and formation of planar inline interconnects and inline VIAs. A thick inline dielectric caps this Backend processing. These Frontend and Backend processing's include all the layering films that have become standard in today's CMOS processes (e.g. Gate Spacer, Ti/TiN films for Contact adhesions, Tantalum to prevent diffusion of Copper from inline Metals when Copper is used in the formation of inline interconnects, Nitride and silicon-Carbide films as Etch-Stop-Layer (ESL), etc. . . . ). Typically few (1 to 2 or 4) layers for planar interconnects are processed, but depending on the complexity of the particular Integrated-Circuit these can be more. Carbon-doped low-K inline dielectric is recommended for lowest RC-Tau, but other inline dielectrics can always be used instead. Air gaps may also be constructed within the inline dielectric to further lower this RC-Tau.

This concludes the formation of the base-layer atop which all sheets of semiconductor films will be vertically stacked.

Step-3: After processing the seed-Wafer and forming this base-Layer, the Wafers that are to be stacked atop the base-Layer are first implanted through their front semiconductor so they can be cut thin after their front semiconductors are processed for their Frontend and Backend and bonded atop the base-Layer through their inline dielectric and processed again on the back surface of their semiconductor.

To achieve this thin cut on the "to be stacked" Wafers after their bonding, an Etch-Stop-Layer (ESL) is first implanted through the front semiconductor of starting Wafers. This ESL can be made of a high dose of Boron implanted into a bulk silicon Wafer at medium energy (<200 KeV). This will then be followed with the growth of low-doped epitaxy onto it. SiGe epitaxy can be also grown and utilized as ESL instead of Boron and silicon epitaxy will be grown next atop this SiGe.

Another similar approach is to Implant Carbon instead of Boron through the front semiconductor of the "to be stacked" Wafer. Carbon is electrically-inactive in silicon and when implanted at temperatures close to 500 degC crystal damage is lowered or minimized. At optimal implant energies and doses, this implanted Carbon forms a very effective ESL 100 nm below the front semiconductor of the stacked-Wafer. Other species (e.g. Nitrogen) may also be implanted instead into the stacked-Wafer to form the ESL.

Shallow Trenches for Isolation (STI) are then processed following same process as in Step-3 and Frontend and Backend are processed afterward atop this low-doped epitaxy similar to the processing of the seed-Wafer. Backend consists of inline dielectric and inline interconnects.

Figure 4:
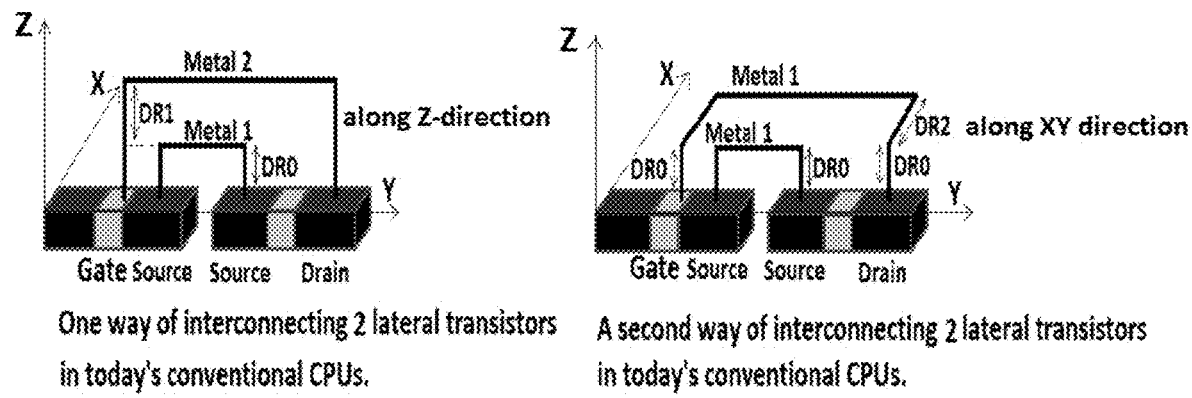
FIG. 4: Schematics showing the shorter interconnects in our new approach to monolithic 3D-IC to connect two lateral transistors together.
Figure 5:
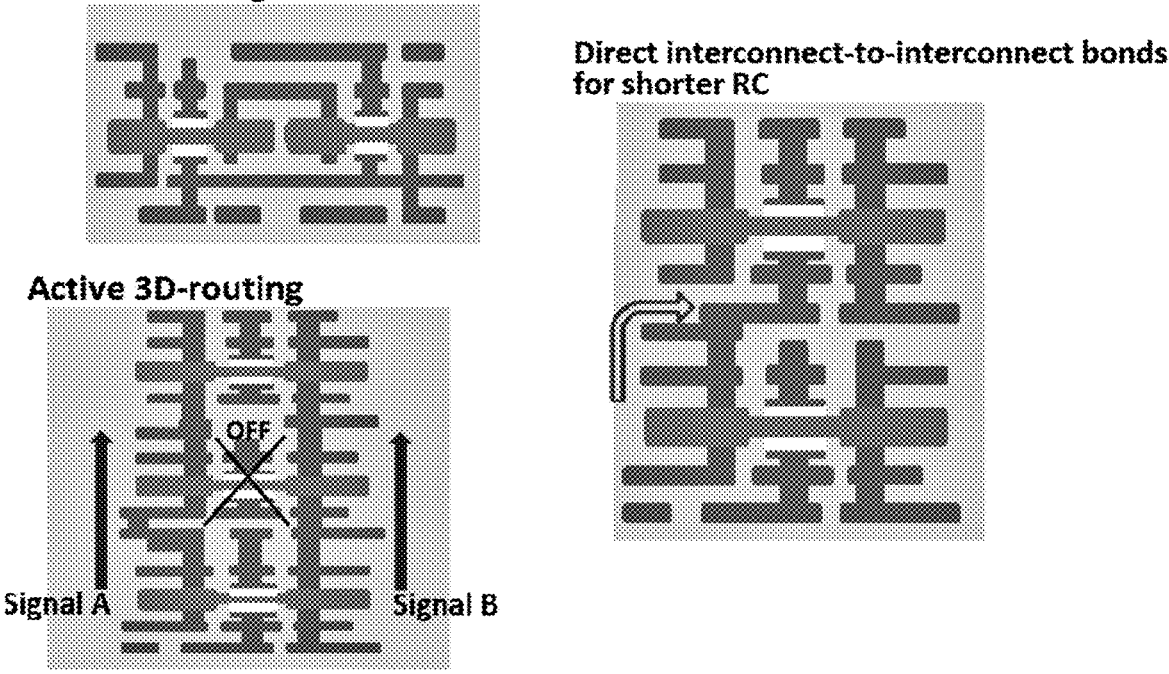
FIG. 5: Cartoon schematics summarizing the main merits of our new approach to monolithic 3D-IC: 1] Shorter top-to-bottom interconnects. 2] Interconnecting from above and below a semiconductor film. 3] Active vertical routing. This can route electric signals in 3D and reconfigure the hardware in real-time.
Figure 6:
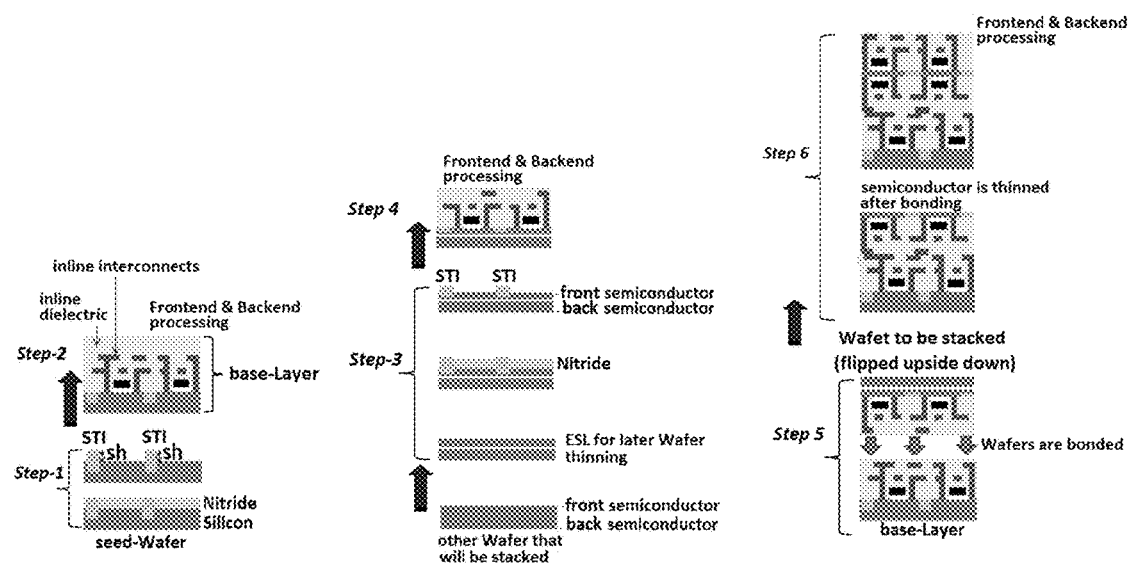
FIG. 6: Cartoon schematics summarizing the main steps in processing the seed Wafer and the "to be stacked" Wafers prior to bonding.

The main processing steps to form the base-Layer and those of the "to be stacked" Wafers are summarized in the schematics of FIG. 4.

Step-4: Because the deposited inline dielectric in "to be stacked" Wafers and in base-Layer can or are known to outgas and creates voids upon being subjected to high temperatures (when these temperatures are typically higher than 300-400 DegC), both the base-Layer and the "to be stacked" Wafers undergo prior to their bonding a high temperature anneal that outgases any by-products or gas molecules that were absorbed during the depositions of the inline dielectrics. This pre-bond anneal is typically anywhere between 800 DegC and 1200 DegC. When using pre-bond anneals above or close to 1000 DegC, tough materials that are tolerant to such high temperatures (e.g. Tungsten) are used as inline interconnects. Similarly, stronger Silicides that are more stable at and around such high temperatures are formed during the Frontend processing. Such Silicides may include: $WSi_2$, $MoSi_2$, $TaSio_2$, and $CoSio_2$. Chemical-Mechanical-Polish (CMP) of the inline dielectrics follows this pre-bond annealing process.

Step-5: The "to be stacked" Wafer is then bonded either through its outer inline interconnects to the outer inline interconnects of the base-Layer after Wafers top inline dielectrics are polished to expose their outer interconnects, or through its outer inline dielectric to the outer inline dielectric of the base-Layer. A post-bond anneal is then performed to strengthen this bond and the two Wafers become one Wafer.

Step-6: After bonding the "to be stacked" Wafer onto the top portion of the Base-layer the back surface of the "to be stacked" Wafer is grinded first so to thin it down to about 30-50 μm. Grinding is recommended first because of its high thinning rate. It is a two-step process that includes a coarse grinding (at ~5 μm/s) and a subsequent fine grinding (at ~1 μm/s). The second step is necessary to remove most of the damage layer created by the coarse grinding and reduce surface roughness. Additional thinning processes are performed next to further thin down this back semiconductor down to 200 nm-100 nm. These may include combinations of dry/wet etching and CMP. The ESL that was implanted in the Step-3: will allow a rapid etch of the back surface so to thin it down to few hundreds nanometers or less before thinning it down further with Plasma Chemical Vaporization Machining (PCVM) and/or MagnetoRheological Finsish (MRF) to its desired, intended or targeted thinness.

Instead of having the ESL implanted during the Step-3: through the front semiconductor of the "to be stacked" Wafer it can be implanted through the back semiconductor of the "to be stacked" Wafer. Carbon can be good choice for this ESL implant.

It may also be possible to omit the use of ESL all together and rely instead on precision numerically controlled etch of the back semiconductor of the "to be stacked" Wafer after its bonding and before or after PCVM and/or MRF finish.

Recent technological advancements in the manufacturing of semiconductors can allow nowadays nano-precision polishing of the surface of semiconductor Wafers through several newer techniques such as: MRF and PCVM. It was reported on the capability from these techniques to successfully scale from removing microns of materials to removing nanometers of material with the ability to improve flatness and thinness. An etch-back of the Silicon was demonstrated through these techniques to thin the silicon down to 13 nm with an about thickness variation of 2 nm only. Among the many works that detailed on such and similar results are; Mori Y et al., "*Development of Plasma Chemical Vaporization Machining*", *Rev. Sci. Instrum.* 2000, 71:4627-4632, Mori Y et al., "*thinning of silicon-on-insulator wafers by numerically controlled plasma chemical vaporization machining*". *Rev. Sci. Instrum.* 2004, 75: 942-946, and, Marc Ticard et al., "*Prime Silicon and Silicon-On-Insulator (SOI) Wafer Polishing with Magnetorheological Finishing (MRF)*", Proceedings of IMECE '03, Washington, D.C, Nov. 15-21, 2003.

Once the "to be stacked" Wafer is thinned to its target thinness that is typically designed to expose its Isolation-trenches to the other side of the semiconductor these Isolation-trenches are then used to similarly align the Frontend on this back semiconductor side to the Frontend that was already processed at the front semiconductor. The back semiconductor is then processed for its Frontend and Backend somewhat similarly to its other side and caped with inline dielectric. Since Copper Inline Metals melt at temperatures equal or higher than 1080 DegC and Silicides become unstable above 900-1000 DegC, lower temperatures (≤700-900 DegC) are recommended for the formations of Gate dielectrics. Similarly RTA anneals that are close to 1000 DegC or lower are also recommended. The other alternative is to use tougher Metals for inline interconnects (e.g. Tungsten), and process stronger Silicides at Frontend. Other "to be stacked" Wafers can be similarly processed and stacked atop the base-Layer similarly.

The vertical stacking of the "to be stacked" Wafers can either be done by having their outer interconnects thermally-bonded directly to the outer interconnects in the base-Layer; for this, the outer inline dielectrics of both base-Layer and "to be stacked" Wafers are first thoroughly polished to expose their outer inline interconnects. The pitch of the outer planar interconnects where bonding occurs can be purposely designed larger than the typical accuracy of today's Inter-substrate alignment on 300 mm Wafers. This makes such direct Interconnects-to-Interconnects bonding feasible. The typical accuracy of today's commercially available Wafer-to-Wafer alignment tools is 0.18 μm, and with the continuing efforts to develop better Wafer-to-Wafer alignment tools, more precise accuracy toward the deep-sub-micrometer regime of the Wafer-level process will be expected to develop in the near future and this is projected to give much tighter processing control for stacking thinned layers of semiconductor films on top of one another. This direct Interconnects-to-Interconnects bonding can either use low temperature Wafer-level thermo-compression bonding or higher temperature bonding. Copper Metals are attractive choice for low temperature thermo-compression bonding in terms of lower cost and the ability to bond Copper at temperatures as low as 250-300 DegC.

Another approach to wiring interconnects of two bonded Wafers is to bond the "to be stacked" Wafer first through its inline dielectric to the outer inline dielectric of the base-Layer. A brute-force continuous etch through an isolation trench into the inline dielectric to dig deep hole between a higher interconnect layer of bottom semiconductor and a lower interconnect layer of upper semiconductor before depositing conductive film to wire them together will damage the lower interconnect layer of upper semiconductor as the continuous etch to expose the higher interconnect layer of lower semiconductor proceeds. For this we have developed our unique etch procedure such: After the back semiconductor of the "to be stacked" Wafer is thinned to expose its Isolation-trenches a deep etch is done through the Isolation-trenches down to the ESL of the higher interconnect Layer of the bottom semiconductor. Sacrificial-Light-Absorbing-Material (SLAM) is deposited next to fill this deep etched trench. A patterning to wire both interconnect layers is done and a selective etching of the SLAM is done next exposing the ESL. The etch chemistry is then switched and different selective etch to etch the inline dielectric and ESL and expose the lower interconnect Layer of the upper semiconductor is performed. The inter-wire material is then deposited and inline dielectric is re-deposited to fill all what was etched from it.

This new etch technique using SLAM demonstrated excellent results in providing very effective inter-wiring of the interconnect layers and in yield when Copper metal was used for interconnects, Nitride films for ESL and Carbon-doped $SiO_2$ as inline dielectric.

Figure 7:
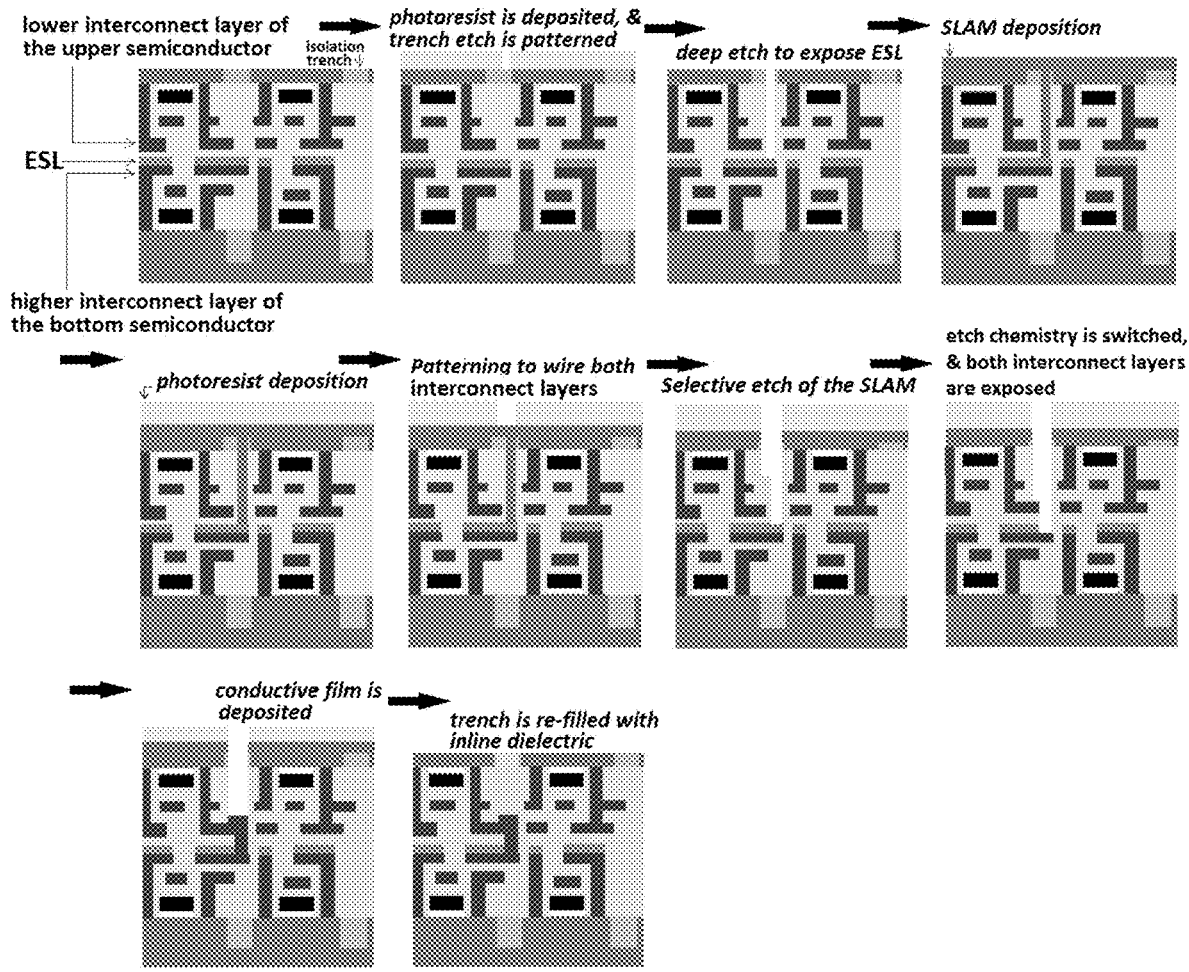
FIG. 7: Schematics that illustrate a new approach to bonding the Wafers through their inline dielectrics and wire their transistors with additional process steps.

The FIG. 7 shows representative Cartoon schematics highlighting the process steps of both approaches.

What is claimed is:

1. A monolithic three-dimensional integrated circuit comprising:
   a plurality of vertically stacked semiconductor layers on top of a bottom semiconductor substrate;
   inline dielectric above the bottom semiconductor substrate and vertically separating the vertically stacked semiconductor layers from each other;
   the bottom semiconductor substrate and each of the plurality of vertically stacked semiconductor layers include at least two transistors, the transistors of the vertically stacked semiconductor layers being horizontally separated from each other by the inline dielectric;
   wherein the transistors in the bottom semiconductor substrate comprise: a gate terminal, a gate dielectric, a source terminal and a drain terminal that connect to a first set of upper interconnects that cut through the inline dielectric above the bottom semiconductor substrate;
   wherein the transistors in each of the plurality of vertically stacked semiconductor layers comprise: an upper gate terminal, an upper gate dielectric, an upper source region and an upper drain region formed on a top side of the semiconductor layer, a lower gate terminal, a lower gate dielectric, a lower source region and a lower drain region formed on the bottom side of the same semiconductor layer; and
   wherein the upper source and upper drain regions of each transistor in each of the plurality of vertically stacked semiconductor layers overlap with the bottom source and bottom drain regions of the same transistor to form a double-sided drain terminal and a double-sided source terminal;
   the double-sided drain terminal, the double-sided source terminal and the upper gate of each transistor connect to a set of top-side interconnects, and the double-sided drain terminal, the double-sided source terminal and the lower gate of each transistor connect to a set of bottom-side interconnects; and
   the first set of upper interconnects are directly bonded to the bottom-side interconnects of at least one transistor of a first vertically stacked semiconductor layer above the bottom semiconductor substrate, and the top-side interconnects of at least one transistor of the first vertically stacked semiconductor layer above the bottom semiconductor substrate are directly bonded to the bottom-side interconnects of at least one transistor of a second vertically stacked semiconductor layer above the first vertically stacked semiconductor layer.

2. A method of interconnecting two interconnect layers, the method comprising:
   forming a lower interconnect layer and a higher interconnect layer within a dielectric layer such that the higher interconnect layer does not extend over the entire lower interconnect layer but may extend partially over it; depositing an etch-stop-layer over the lower interconnect layer during this formation;
   performing an etch through the dielectric layer from a top surface of the dielectric layer to the etch-stop-layer (ESL) of lower interconnect layer to form a trench, wherein the trench has a width XTR and is positioned a lateral distance XD from the higher interconnect layer;
   depositing Sacrificial-Light-Absorbing-Material (SLAM) into the trench and along the top surface of the dielectric layer;
   depositing a photoresist above the SLAM and patterning the photoresist to include a hole which overlaps the trench and has a width that is greater than the sum of XTR+XD;
   selectively etching the SLAM in the trench to expose the ESL of lower interconnect layer;
   etching the dielectric layer and the ESL of lower interconnect layer through the hole in the photoresist to expose the higher interconnect layer and the lower interconnect layer; and
   depositing an electrically conductive film in the trench to connect the lower interconnect layer and the higher interconnect layer; this is then followed with depositing dielectric to refill the rest of the trench.

* * * * *